(12) United States Patent
Deguchi et al.

(10) Patent No.: US 6,281,145 B1
(45) Date of Patent: Aug. 28, 2001

(54) APPARATUS AND METHOD FOR APPLYING PROCESS SOLUTION

(75) Inventors: Masatoshi Deguchi; Kosuke Yoshihara, both of Kumamoto (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/312,542

(22) Filed: May 14, 1999

(30) Foreign Application Priority Data

Jun. 5, 1998 (JP) .................................................. 10-173974

(51) Int. Cl.$^7$ .......................... H01L 21/31; H01L 21/469; B05G 11/00
(52) U.S. Cl. ............................ 438/782; 438/758; 118/52; 118/64; 118/313
(58) Field of Search ..................................... 438/782, 758; 118/52, 64, 313

(56) References Cited

U.S. PATENT DOCUMENTS 6,113,694 * 9/2000 Davis ................................... 118/663

FOREIGN PATENT DOCUMENTS 64-64218  3/1989 (JP) .

\* cited by examiner

*Primary Examiner*—John F. Niebling
*Assistant Examiner*—Alexander G. Ghyka
(74) *Attorney, Agent, or Firm*—Fulbright & Jaworski L.L.P.

(57) ABSTRACT

A process solution applying apparatus comprising a substrate holding mechanism for holding a substrate, a process solution supplying system for applying process solution in a prescribed amount to the substrate held by the substrate holding mechanism, the process solution supplying system having a supplying mechanism for changing a rate at which the process solution is supplied, and a substrate rotating mechanism for rotating the substrate holding mechanism, thus rotating the substrate at a predetermined speed to spread the process solution by virtue of centrifugal force and to coat the substrate with the process solution.

12 Claims, 6 Drawing Sheets

APPARATUS AND METHOD FOR APPLYING PROCESS SOLUTION

BACKGROUND OF THE INVENTION

The present invention relates to an apparatus for applying process solution, such as resist solution, to coat a substrate with a film of the process solution in a process of manufacturing, for example, a semiconductor device or a LCD.

In the step of performing photolithography to manufacture a semiconductor device, a wafer is coated with resist solution, thereby forming a resist film on the wafer. The resist film is exposed to a predetermined circuit pattern and then developed, thus forming a specific pattern in the resist film.

To coat wafers with resist solution, spin coating is generally utilized. In the spin coating, a wafer is held on a spin chuck by means of vacuum suction. The resist solution is dripped onto the wafer while a motor rotates the wafer. The solution spreads over the entire surface of the wafer by virtue of centrifugal force, forming a resist film having a predetermined thickness. A pump, such as a bellows pump, is used to drip the resist solution onto the wafer. That is, the pump discharges the solution in a prescribed amount and at a predetermined rate.

In recent years, device patterns have become more complex, each consisting of more components arranged in higher density. The thickness uniformity of resist film is therefore considered very important. Since resist solution is expensive, it is necessary to apply the solution to a wafer in an amount as small as is possible. Hence, it is demanded that the resist solution be applied in a small amount and that the resist solution forms a resist film having a uniform thickness.

To meet the demand, the conditions of applying resist solution to a wafer must be minutely controlled in accordance with the physical properties of the resist solution. These conditions cannot be controlled in the conventional apparatus and method for applying resist solution. Particularly in a conventional apparatus, wherein nozzles are interchangeably used, one at a time, to apply various types of resist solutions to wafers, the resist solutions are applied at the same rate though they differ in physical properties. Consequently, it is difficult to form resist film having an appropriate uniform thickness.

BRIEF SUMMARY OF THE INVENTION

The present invention has been made in view of the foregoing. Its general object is to provide an apparatus, which can apply process solution, such as resist solution, forming a resist film of the solution having a uniform thickness even if the solution is applied in an extremely small amount.

A more specific object of this invention is to provide a process solution applying apparatus which can serve to form a film of the solution having a uniform thickness, whichever type of solution it applies.

According to the main aspect of the invention, there is provided a process solution applying apparatus comprising: a substrate holding mechanism holding a substrate; a process solution supplying system for applying process solution in a prescribed amount to the wafer held by the substrate holding mechanism; and a substrate rotating mechanism for rotating the substrate holding mechanism. The process solution supplying system has a supplying mechanism for changing a rate at which the process solution is supplied. When the substrate rotating mechanism rotates the substrate holding mechanism, the wafer is rotated at a predetermined speed to spread the process solution by virtue of centrifugal force and to coat the substrate with the process solution.

Having this structure, the process solution applying apparatus can apply resist solution at a controlled rate, thereby forming a film having a uniform thickness on the entire surface of a wafer, even if the solution is applied to the wafer in a very small amount of 2.0 mL or less which may otherwise greatly influence the thickness uniformity of the film.

Preferably, the process solution applying apparatus may further comprise a control device for controlling the supplying mechanism. The control device has an input section for receiving data representing the type of the resist solution and a supply speed control section for determining a rate of applying the process solution in accordance with the type of the process solution and for driving the supplying mechanism.

The rate of applying the process solution may have such a value that the solution applied in the prescribed amount forms a film having a uniform thickness on an entire surface of the substrate. In the case where the process solution is resist solution, it may be applied each time in an amount of 2.0 mL or less.

The solution may be heated to an appropriate temperature before it is applied to the substrate. The temperature depends upon the type of the solution. The solution may be one that contains a solvent or the like.

Preferably, the process solution applying apparatus may have a plurality of process solution supplying systems for supplying different types of process solutions. In this case, the apparatus further comprises a control device for controlling the supplying mechanism. The control device has a selection section for selecting one of the resist solution supplying systems in accordance with the type of the resist solution to be applied and a supply control section for determining a rate of applying the resist solution through the selected resist solution supplying system and for driving the supplying mechanism.

The supplying mechanism has a positive-displacement pump for drawing and discharging a prescribed amount of process solution and a stepping motor for driving the positive-displacement pump and changing a rate of discharging the process solution when controlled in terms of rotation speed.

The positive-displacement pump may be, for example, a bellows pump having bellows. The bellows may be driven by a ball screw mechanism which in turn is driven by the stepping motor.

According to another aspect of the present invention, there is provided a resist solution applying method comprising the steps of: holding a substrate; applying process solution in a prescribed amount to the wafer and at such a rate that the process solution forms a film having a uniform thickness on the substrate; and rotating the substrate holding mechanism, thus rotating the wafer at a predetermined speed to spread the process solution by virtue of centrifugal force and to coat the substrate with the process solution.

Those skilled in the art will understand the other features and advantages of the present invention will be understood from the following detailed description of the embodiments and by reference to the accompanying drawings.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described with reference to the accompanying drawings.

As stated previously, the present invention is to control the rate of applying resist solution to form a resist film of uniform thickness on the entire surface of a wafer, when the resist solution is applied each time in a very small amount of, for example, 2 mL or less.

That is, the inventors hereof have found that when resist solution is applied each time in a small amount of 2 mL or less, a resist film having a uniform thickness cannot be formed on an 8-inch wafer, for example, unless the rate of applying the solution is controlled. This fact can be understand by reference to FIGS. 1 and 2.

Figure 1:
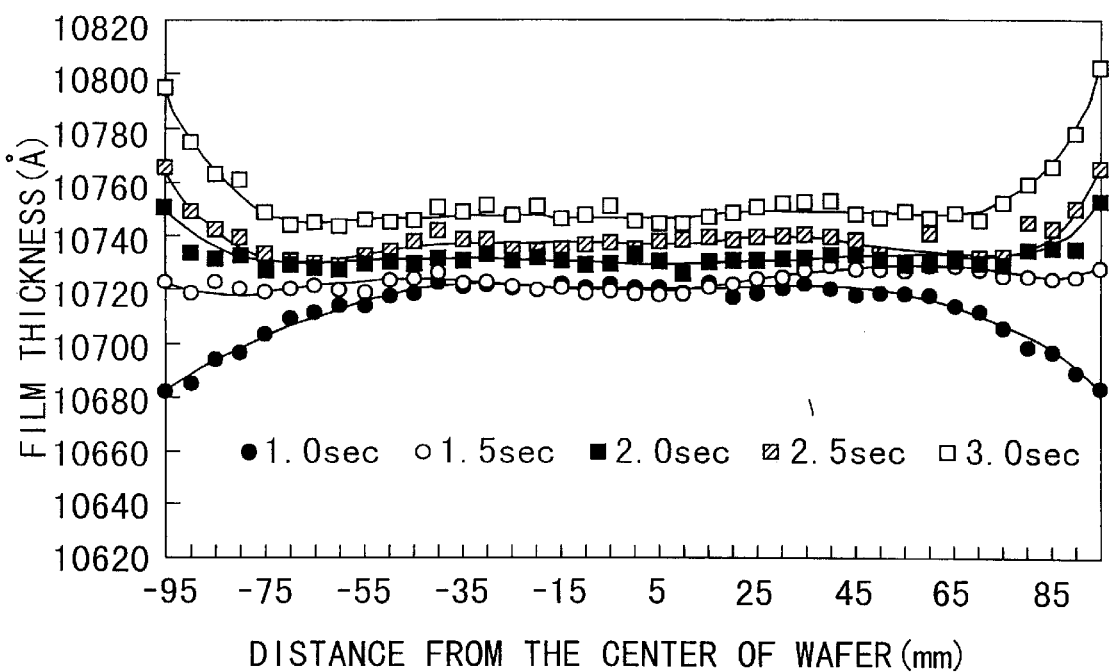
FIG. 1 is a chart representing the relation between the time of applying resist solution and the thickness of resist film.

FIG. 1 is a chart representing various thickness distributions of resist films formed by applying resist solution PFI38A9, 8cp (SUMITOMO) heated to 23.3° C. to wafers over different periods of time, each time in the same amount of 1.5 mL through a nozzle having an inner diameter of 1.5 mm. In the chart, the thickness (in angstrom) is plotted on the Y-axis and the distance (in millimeter) from the center of the wafer is plotted on the X-axis. As can be seen from the chart, the thickness of resist film greatly varies at the peripheral part of the wafer, depending upon the rate of applying the resist solution to the wafer. From the chart it can be understood that the thickness varies least when the resist solution is applied over the period of 1.5 seconds, or at the rate of 1.33 mL/s (=2.0 mL/1.5 sec).

Figure 2:
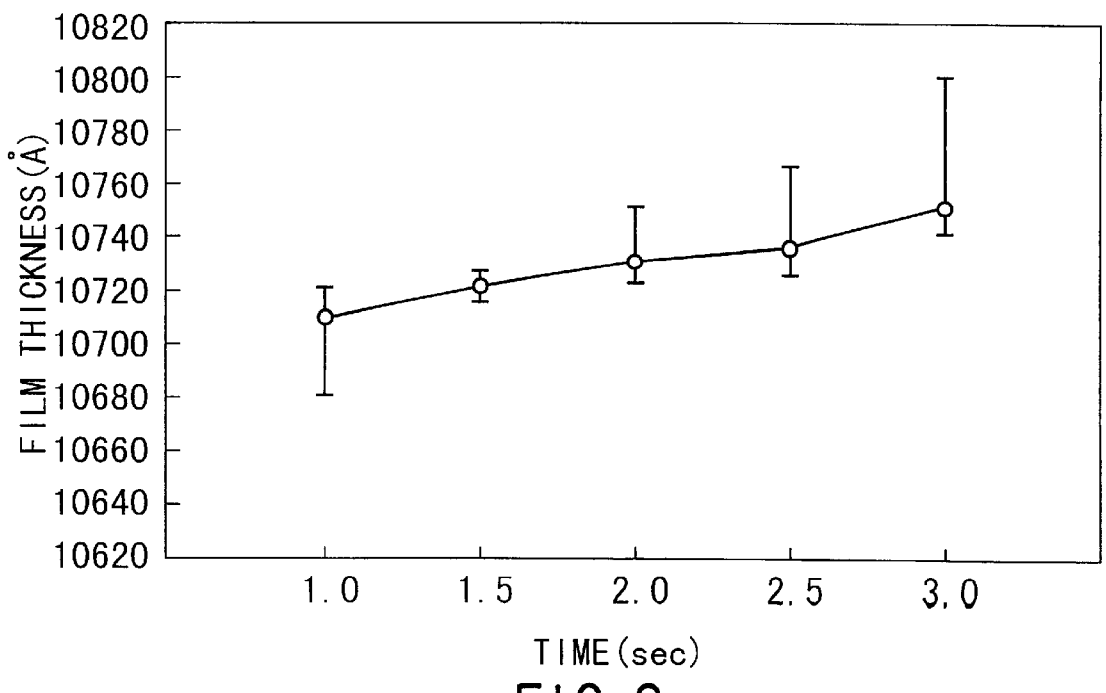
FIG. 2 is a chart illustrating the relation between the time of applying resist solution and the thickness distribution of resist film.

FIG. 2 is a chart representing the relation between the time of applying resist solution and the range of thickness of resist film (i.e., the difference between maximum thickness and minimum thickness). This chart also shows that the thickness varies least when the resist solution is applied over the period of 1.5 seconds.

It is natural that the thickness of the resist film should depend on parameters other than the rate of applying resist solution. Nonetheless, the rate of applying resist solution remains a parameter of vital importance. The main factor resulting in changes in the thickness uniformity of the film, which depend on the rate of applying the resist solution, seems to be the viscosity of the process solution, and other properties of the solution appear to influence the thickness uniformity of the resist film, too. If another type of process solution is used, the appropriate rate of applying the solution is different.

The present invention is based on the inverters' finding described above. It provides a resist solution applying apparatus that can controls the rate of applying resist solution with high precision, in accordance with the type of the resist solution used.

Figure 3:
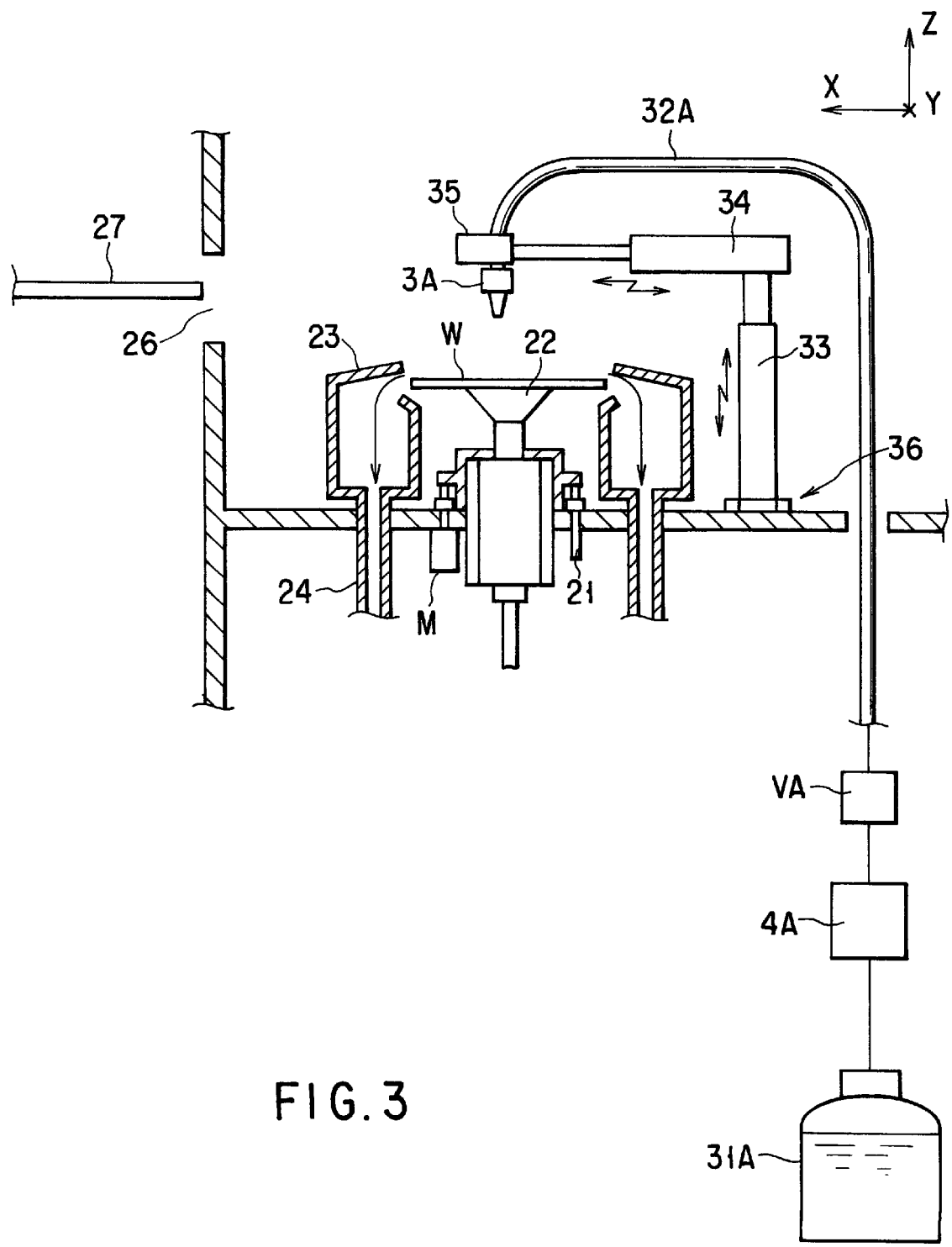
FIG. 3 is a sectional view of a resist solution applying apparatus according to the invention.
Figure 4:
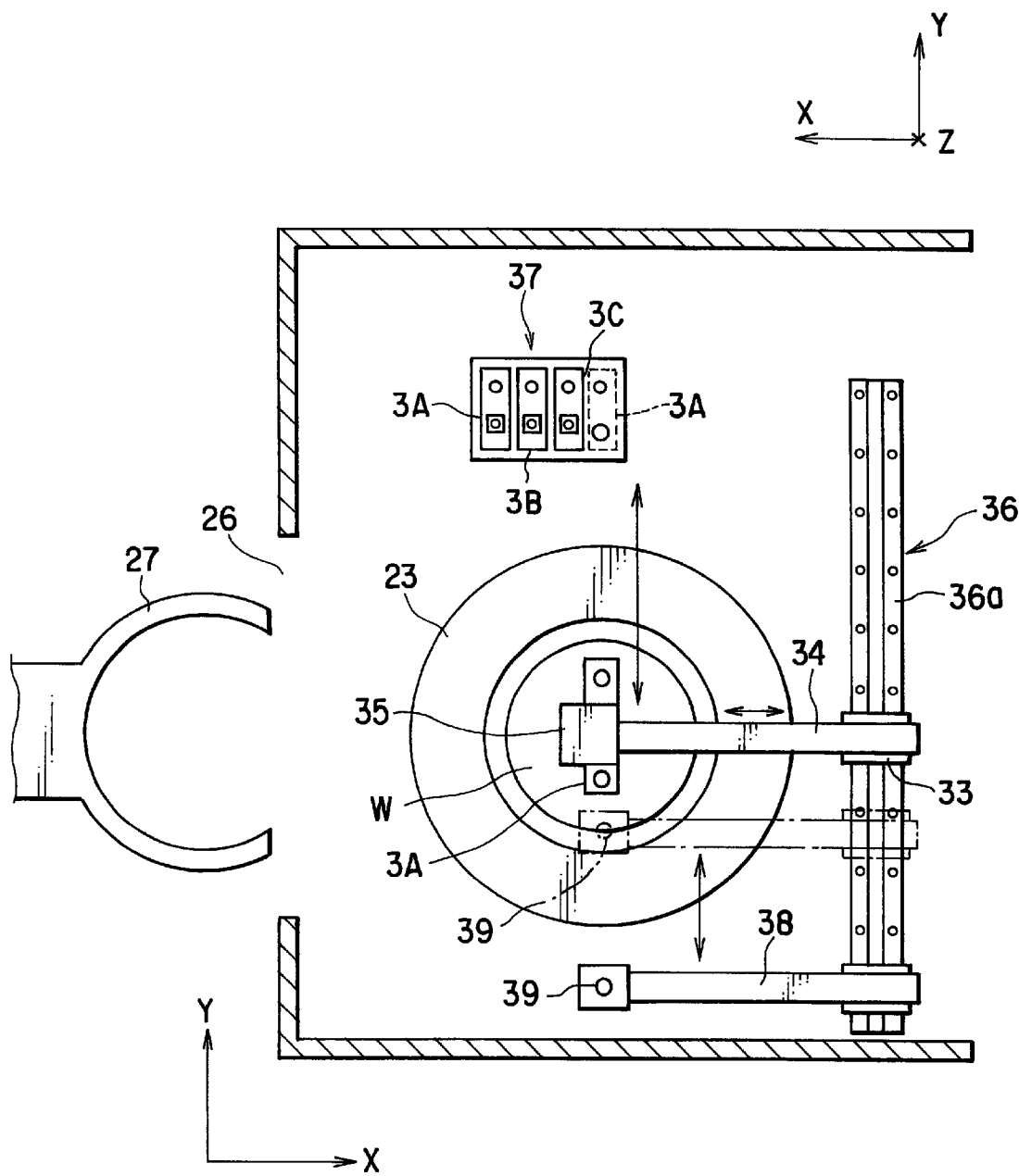
FIG. 4 is a plan view of the resist solution supplying apparatus according to the invention.
Figure 5:
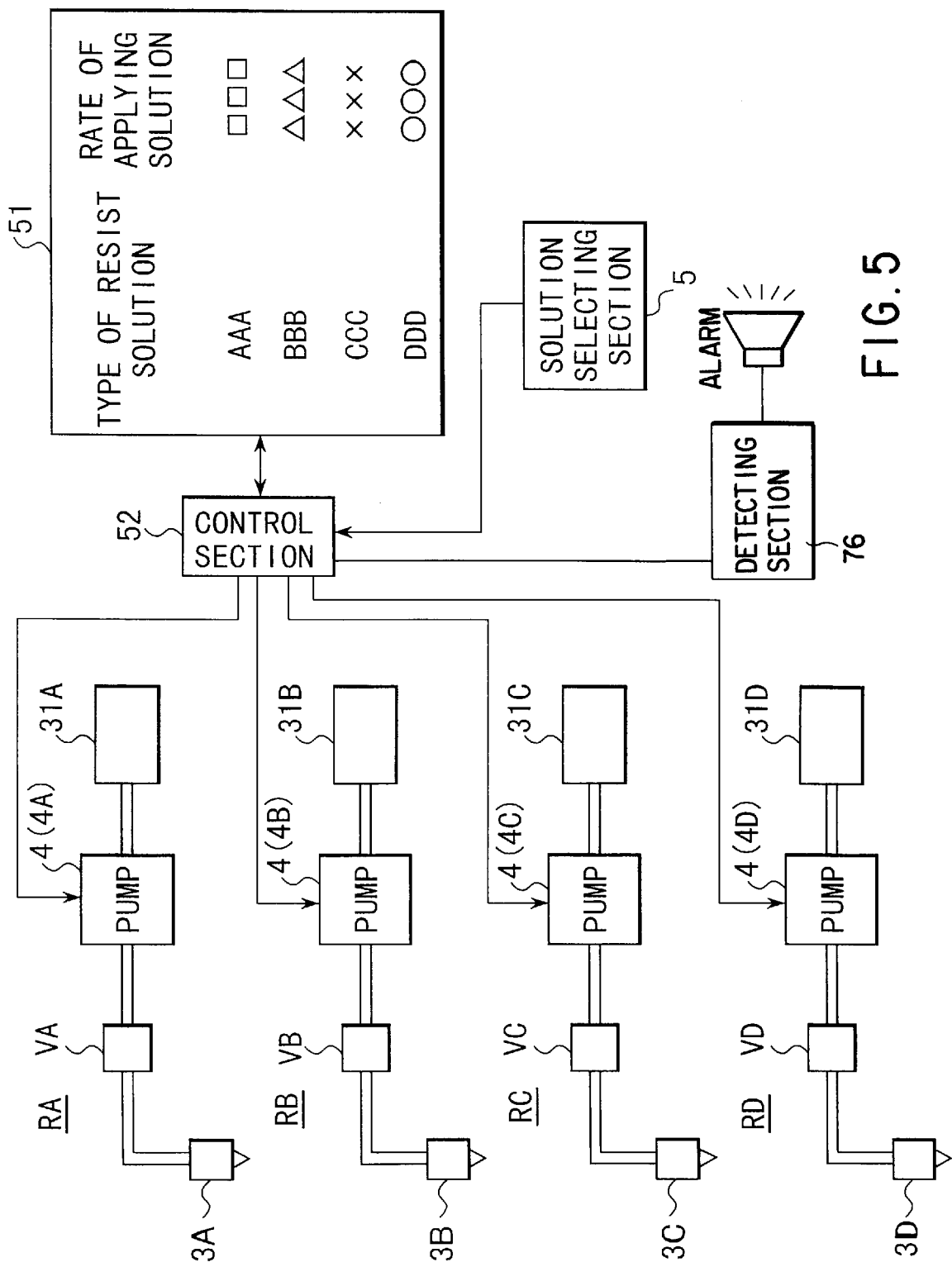
FIG. 5 is a diagram showing one section of the apparatus according to the invention.

FIGS. 3 and 4 are, respectively, a sectional view and plan view of a resist solution applying apparatus according to the invention. FIG. 5 is a diagram showing a major section of the apparatus.

As FIG. 3 shows, the apparatus has an elevator 21 and a spin chuck 22. The elevator 21 can move up and down the spin chuck 22. The chuck 22 holds a wafer on its upper surface with a suction force and can be rotated by a motor M. A nozzle 3A is arranged above the spin chuck 22. The nozzle 3A is connected to a resist solution tank 31A by a solution supply tube 32A. A valve VA and a pump 4A are provided on the solution supply tube 32A. The pump 4A draws up the resist solution from the tank 31A and supplies the resist solution via the valve VA to the nozzle 3A. The nozzle 3A can drip the solution onto the wafer W held on the spin chuck 22. As will be described later in detail, the pump 4A is designed to supply the resist solution at various rates.

An annular cup 23 surrounds the spin chuck 22, for receiving residual resist solution removed from the wafer W while the chuck 22 is rotating the wafer W. The residual resist solution is discharged from the cup 23 through a draining pipe 24.

As shown in FIG. 3, the nozzle 3A is secured by a holder 35 to a Z-axis drive mechanism 33 and an X-axis drive mechanism 34, which constitute an L-shaped drive unit. The proximal end of the Z-axis mechanisms 33 is held by a Y-axis mechanism 36. Hence, the nozzle 3A can be moved in X, Z and Y directions.

As shown in FIG. 4, the Y-axis drive mechanism 36 has a Y-axis rail 36a, which extends outside the cup 23 in the Y direction. Therefore, the nozzle 3A can be moved between the wafer W and a home position 37. At the home position 37, three nozzles 3B to 3D are provided to replace the nozzle 3A. In the case shown in FIG. 4, the nozzle 3A is not at the home position 37 because it is held by the holder 35. Each of the nozzles 3A to 3D can be held by the holder 35 by coupling the engagement strip of the nozzle to the holder 35 in vertical direction.

The nozzles 3A to 3D are provided for different types of resist solutions and are connected, respectively, by four solution supply tubes to four resist solution tanks that contain the different types of resist solutions. Each resist tank, the associated nozzle, and the components located between the tank and nozzle shall be called "solution supply system." Thus, this resist solution supplying apparatus has four resist solution supply systems RA, RB, RC and RD.

FIG. 5 is a schematic diagram showing the four solution supplying systems RA to RD and the control system for controlling these systems RA to RD.

As described above, the solution supplying systems RA to RD are provided for supplying four types of resist solutions, respectively. More specifically, the first solution supply system RA supplies resist solution AAA, the second solution supply system RA supplies resist solution BBB, the third solution supply system RC supplies resist solution CCC, and the fourth solution supply system RA supplies resist solution DDD.

The control system comprises a solution selecting section 5, a data storage section 51, and a control section 52. The solution selecting section 5 selects one of the four types of resist solutions (AAA, BBB, CCC and DDD). The data storage section 51 stores data representing four solution applying rates prescribed for the four types of resist solutions, respectively. The control section 52 are designed to generate and supply a control signal to the pump for supplying the resist solution selected by the solution selecting section 5.

Figure 6:
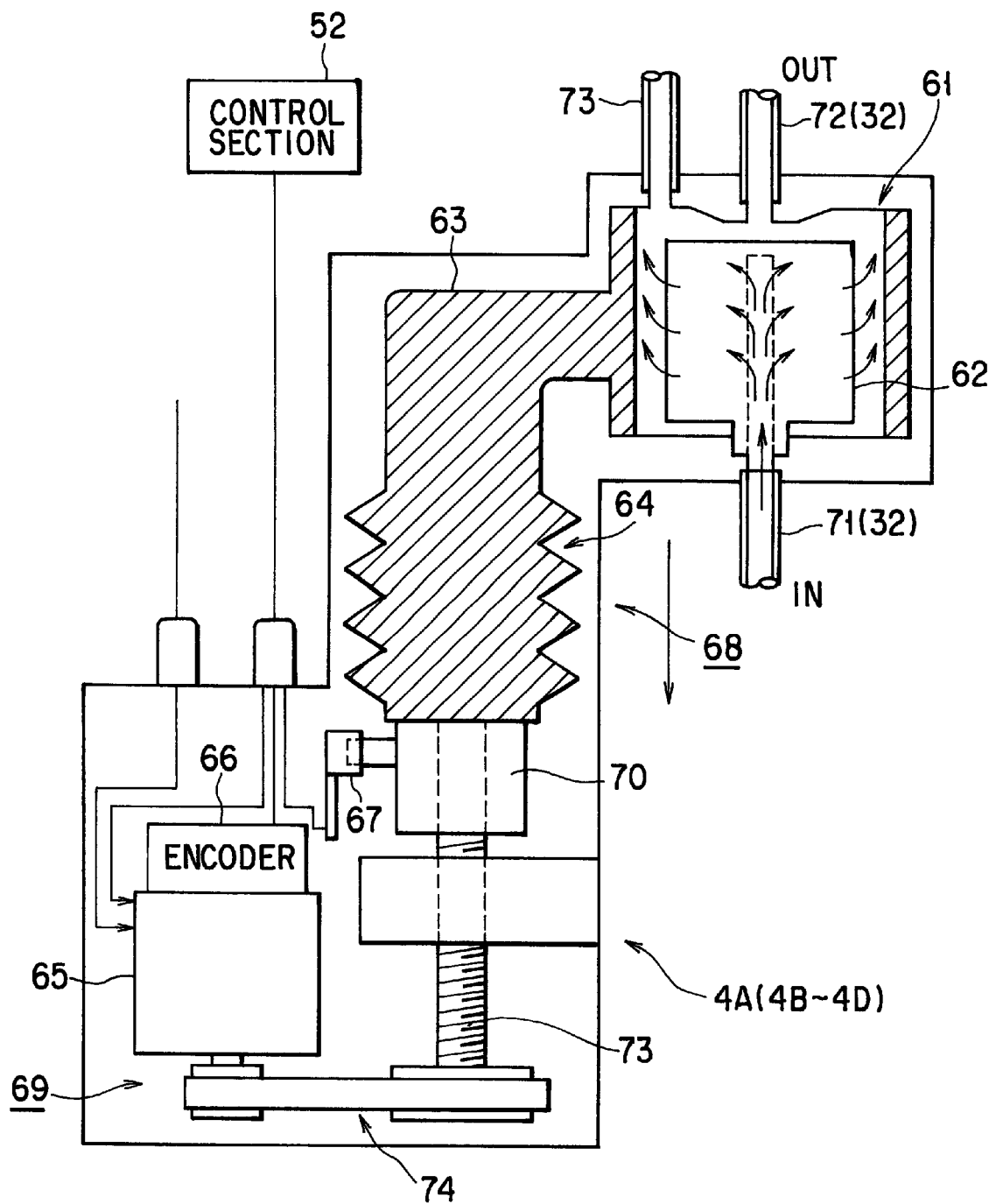
FIG. 6 is a sectional view of a pump for use in the apparatus according to the invention.

The pumps 4A to 4D of the solution supplying systems RA to RD can each supply a resist solution at different rates. FIG. 6 shows the structure of the pump 4A. The other pumps 4B, 4C and 4D have the same structure as that of pump 4A, therefore description thereof will be omitted.

As shown in FIG. 6, the pump 4A has a pump section 68 and a drive mechanism 69. The mechanism 69 drives the pump section 68.

The pump section 68 is a bellows pump. That is, the pump section 68 comprises a pump chamber 61, an inlet pipe 71, an outlet pipe 72, a bubble vent 73, a filter 62, a tubefrahm 63, and bellows 64. The inlet pipe 71 and outlet pipe 72 are parts of the solution supply tube 32A.

When the bellows 64 are expanded, the pump chamber 61 expands to draw the resist solution through the inlet tube 71. When the bellows 64 are compressed, the pump chamber 61 shrinks to discharge the resist solution through the outlet pipe 72. More correctly, when the lower end of the bellows 64 is pulled downwards, expanding the bellows 64, the resist solution is drawn from the resist solution tank 31A into the pump chamber 61 via the inlet pipe 71. The resist solution is thereby held in the chamber 61, in a predetermined amount to be applied at one time through the nozzle 3A. When the lower end of the bellows 64 is pushed upwards, compressing the bellows 64, the resist solution is discharged from the pump chamber 61 through the outlet pipe 72 to the nozzle 3A. The resist solution is applied, in the predetermined amount, from the nozzle 3A to the wafer W held on the spin chuck 22. Though not shown in FIG. 4, a check valve (not shown) is provided on each of the pipes 71 and 72.

The bellows 64 are driven by the drive mechanism 69. The drive mechanism 69 comprises a nut 70, a ball screw 73, and a stepping motor 65. The nut 70 is fastened to the lower end of the bellows 64 and mounted on the ball screw 73. The stepping motor 65 can rotate the ball screw 73 with assistance of a belt transmission mechanism 74. When the motor 65 rotates the ball screw 73, the nut 70 moves up to compress the bellows 64 or moves down to expand the bellows 64.

An encoder 66 is attached to the stepping motor 65, for detecting the rotation of the shaft of the motor 65. The encoder 66 generates a signal representing the rotation phase of the motor shaft, and the signal is fed back to the control section 52. The pump 4A further has a position detector 67 for detecting the position of the nut 70. In other words, the position detector 67 detects how much the bellows 64 have been compressed or expanded. The output signal of the detector 67 is fed back to the control section 52, too. The position detector 67 may be a photosensor or the like.

The rotation phase of the stepping motor 65, is controlled in accordance with the output signal of the position detector 67, which represents how much the bellows 64 have been compressed or expanded. Hence, it is possible to control the amount of resist solution to be applied at a time. Further, the rate of applying the solution can be controlled by changing the rotational speed of the stepping motor 65.

The sequence of applying resist solution, performed by the resist solution applying apparatus shown in FIGS. 3 and 4, will be explained.

First, the wafer transfer arm 27 shown in FIGS. 3 and 4 holds a wafer W and transfers the wafer W into the resist solution applying apparatus through a window 26 made in one side of the apparatus. In the apparatus, the arm 27 positions the wafer W right above the spin chuck 22.

The spin chuck 22 is elevated until it reaches the wafer W. The spin chuck 22 draws the wafer W from the arm 27 with a suction force, subsequently holding the wafer W on its upper surface. The wafer transfer arm 27 is withdrawn from the resist solution applying apparatus. Thereafter, the spin chuck 22 is moved downwards and spun at, for example, 3500 rpm.

Assume that the solution selecting section 5 has selected the resist solution PFI, or solution AAA. In this case, the nozzle 3A is moved from the home position 37. The holder 35 holds the nozzle 3A. The X-, Y- and Z-axis mechanisms 34, 36 and 33 cooperate, moving the nozzle 3A to a position, where the nozzle 3A is located above the center of the wafer W. The data representing the rate of applying the solution AAA is read from the data storage section 5. The stepping motor 65 of the pump 4A is spun at the speed corresponding to the rate of applying the solution AAA. The motor 65 is stopped upon reaching the rotation phase corresponding to the amount in which the solution AAA should be applied at a time.

In this instance, the resist solution (AAA) is PFI38A9, 9cp, the amount of solution to be applied at a time is 1.5 mL, and the nozzle 3A has an inner diameter of 1.5 mm. Data representing a solution applying rate of 1.33 mL/s is read from the data storage section 51. The rotation speed of the motor 65, which is corresponding to the solution applying rate of 1.33 mL/s is set on the basis of the reduction ratio of the belt transmission mechanism 74.

The resist solution is thereby applied through the nozzle 3A at the best possible rate for this particular type of the solution to form a resist film having a uniform thickness on the entire surface of the wafer W. The resist solution, thus applied, spreads all over the wafer W, forming a resist film, by virtue of the centrifugal force acting on the surface of the wafer W.

After the application of the resist solution, the rotation speed of the spin chuck 33 is lowered to, for example, about 2700 rpm. The thickness of the resist film is thereby controlled to a desired value that the resist film should finally have. To make the resist film thinner, it suffices to rotate the wafer W faster, that is, at a speed higher than the value mentioned above.

When the wafer W is completely coated with the resist solution, the rinse nozzle 39 shown in FIG. 4 is moved to a position, where it opposes the peripheral part of the wafer W. Rinse solution is applied through the nozzle 39 to the peripheral part of the wafer W. The residual resist solution is thereby removed from the peripheral part of the wafer W. The rinse nozzle 39 is secured to a nozzle support 38, which is mounted on the above-mentioned Y-axis rail 36a.

The resist solution applying apparatus described above can apply resist solution at a controlled rate, thereby forming a resist film having a uniform thickness on the entire surface of a wafer, even if the solution is applied to the wafer in a very small amount of 2.0 mL or less.

The rate of applying the resist solution can be controlled with high precision since it is adjusted by controlling the stepping motor 65. In addition, the amount in which the resist solution is applied each time can be controlled with high precision, too, without dripping from the nozzle even if the solution has low viscosity like those used recently. This is because the stepping motor 65 has high responsibility.

Further, it is desirable to utilize the stepping motor 65 to determine the amount of the resist solution remaining in the resist tank 7. This will now be described below:

That is, as is explained previously, the control section 52 detects and controls the rotation phase of the stepping motor 65, thereby controls the amount of the resist solution to be applied on the wafer W. Since the initial amount of the resist solution filled in the tank 31 is known, it is possible to calculate beforehand the total rotation phase (number of the control pulse) of the stepping motor 65 to supply or consume all the resist solution filled in the tank 31.

A detecting section 76, for detecting the remaining amount of the tank 31, is connected to the controlling section 52. The detecting section 76 counts driving pulses output by the encoder 66 to calculate the rotation phase of the stepping motor 65, thereby detecting the remaining amount of the resist solution in the tank 31. When the detecting section 76 detect that the tank 31 is almost empty, cause a alarm mechanism to give warning.

In the case of a gallon bottle, which is generally used as the resist solution tank 31 in the resist solution coating apparatus, 1.5 bottles are needed a day. Therefore, the gallon bottle must be replaced at least once a day.

Further, the detecting section 76 can also be configure to detect the timing of replacing a filter (not shown) which generally used for removing impurities from the developing solution. Where the filter is the one connected just before the nozzle 31A, replacing the filter is needed at least once in two months, if the ordinary amount of the resist solution passed through the filter.

As stated previously, the amount of the resist solution passing through the filter can be detected according to the rotation phase of the stepping motor 65. Therefore, defining the timing of replacing the filter as a specific rotation phase of the stepping motor 65, it is possible to detect the timing of replacing a filter, in the same way as described for detecting the remaining amount of the resist solution in the tank 31.

Therefore, in this case, the filter should be replaced every time the 100 gallon bottles are consumed, because, in the case where the 1.5 gallon bottles are needed in a day, about 100 gallon bottles are consumed in two months.

Comprising these components, an extra unit, such as an intermediate tank (not shown) for detecting the amount of the solution remaining in the tank or the time of replacing the filter, is not needed, whereby the resist applying system is simplified.

Next, a coating-developing system, which incorporates the resist solution applying apparatus according to the invention and in which the resist solution applying method according to the invention is performed, will be described with reference to FIGS. 7 and 8.

Figure 7:
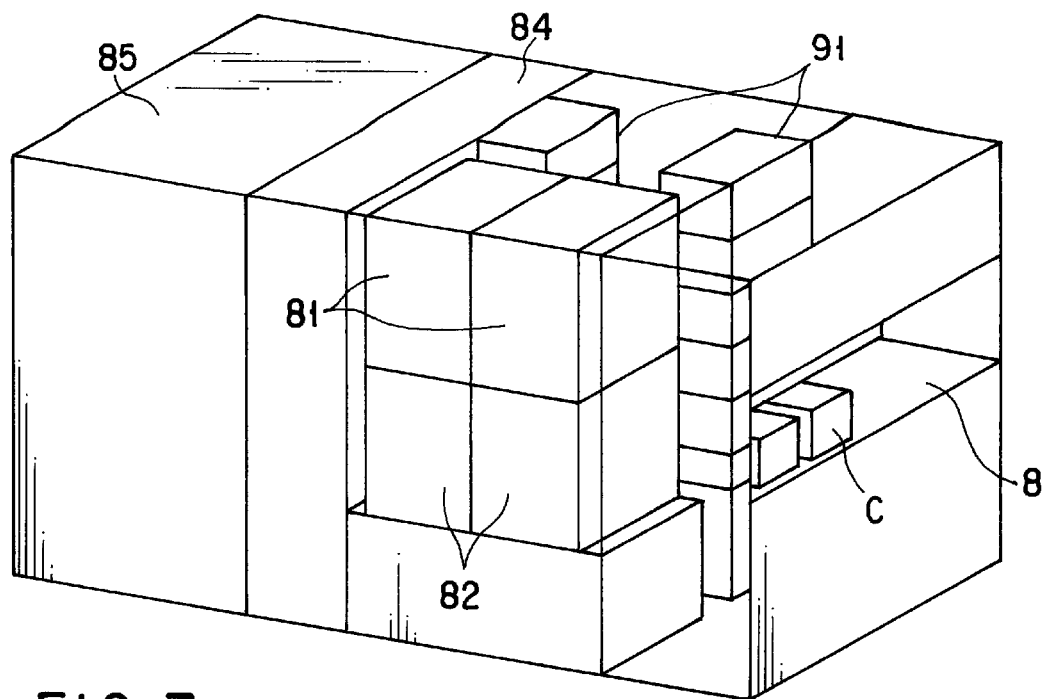
FIG. 7 is a perspective view of a coating-developing system that incorporates the apparatus according to the invention.

As shown in FIG. 7, a cassette transfer stage 8 is provided for transferring wafer cassettes C. The wafer cassettes C, each storing, for example, 25 wafers, are mounted onto to the stage 8 by means of an automatic cassette-transporting robot. The coating-developing section and the heating-cooling section are provided at the back of the cassette transfer stage 8 and located on the right side and the left side, respectively, as seem from the cassette transfer stage 8.

The coating-developing section comprises, for example, two developing units 81 at an upper stage and two coating units 82 at a lower stage. As shown in FIGS. 7 and 8, the developing units 81 are mounted on the coating units 82, respectively. As shown in FIG. 8, the heating-cooling section comprises heating units 91 and cooling units 92, some located above the others. A wafer transfer unit 90 is provided in the arrangement of these units. In effect, the heating-cooling section further comprises an adhesion unit, but the adhesion unit is not shown in FIG. 7 or FIG. 8 for the sake of simplicity.

Figure 8:
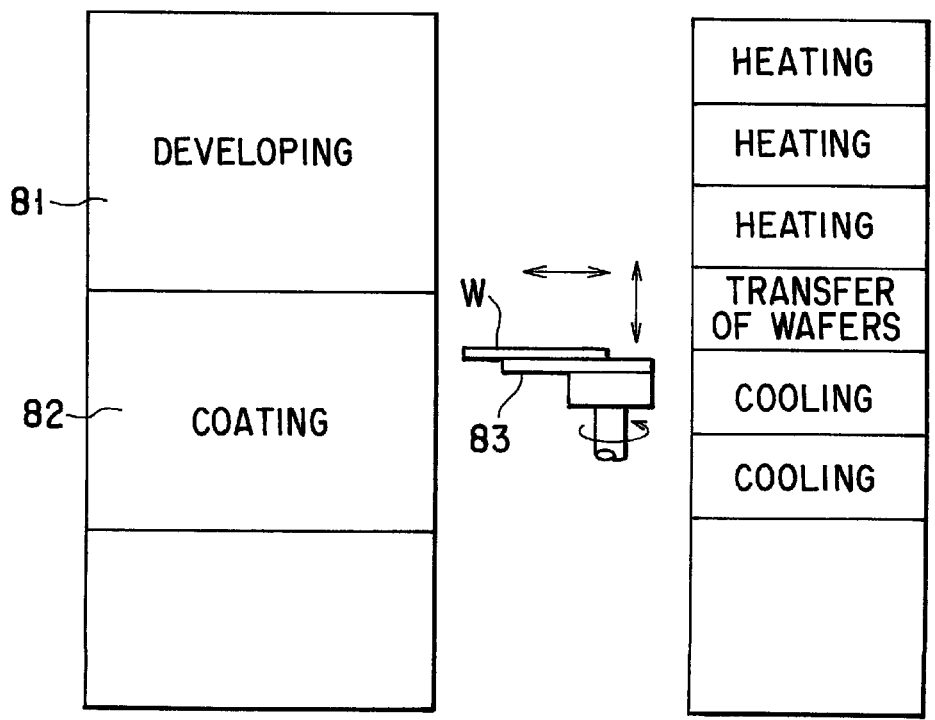
FIG. 8 is an exploded side view of the system shown in FIG. 7.

As FIG. 8 shows, a wafer transfer arm 83 is provided between the coating-developing section and the heating-cooling section. The wafer transfer arm 83 is designed to move up and down, to the left and the right, and back and forth, and to rotate around a vertical axis. Thus, the arm 83 can transfer wafers W between the coating-developing section and the heating-cooling section. The arm 83 can also move to and from an interface unit 84, which will be described later.

The section including the coating-developing section and the heating-cooling section is known as "clean track (trade name)." The interface unit 84 is interposed between the clean track and the exposure apparatus 85. Through the interface unit 84, wafers W are transported between the clean track and the exposure apparatus 25 by means of a transport system (not shown).

The transfer of wafers in the coating-developing system will be explained. At first, a wafer cassette C containing wafers W is transported onto the cassette transfer stage 8. A wafer transfer arm (not shown) takes a wafer W from the cassette C. This wafer W is transported through the wafer transfer unit 90 and the wafer transfer arm 83 to the adhesion unit(not shown) provided in the arrangement of the heating units 91 and cooling units 92, for performing adhesion treatment to the wafers. The wafer W, adhesion treatment was performed, is inserted into a coating unit 82 and coated with resist film. The wafer W is then moved from the unit 82 into a heating unit 91 and heated therein. The wafer W is transported to the exposure apparatus 85 via the interface unit 84. In the exposure apparatus 85, the wafer W is exposed to light through a mask.

Thereafter, the wafer W is heated in a heating unit 91, cooled in a cooling unit 92, and developed in a developing unit 81. A predetermined pattern resist mask is thereby formed on the wafer W. The wafer W is transported to the cassette transfer stage 8 and inserted back into the wafer cassette C.

Glass substrates for use in liquid crystal displays may be processed in the same way as wafers W in the coating-developing system. Further, a solution that contains precursor of silicon oxide film may be applied, in place of the resist solution.

The present invention is not limited to the embodiment described above. Various changes and modification can be made without departing from the scope of the invention.

The numerical values are, of course, not limited to the one used in the embodiment described above. They must be selected in accordance with the conditions in which the resist solution applying apparatus is operated. For example, the rate of applying the solution must be changed in accordance with the inner diameter of the nozzle used, the rotation speed of the wafer, and the like, to attain the best possible results.

Moreover, the resist solution applying apparatus may have only one solution supplying system, instead of four solution supplying systems RA to RD.

Furthermore, the pumps 4A to 4D are not limited to bellows pumps. Rather, pumps of any other type can be used instead, so long as they can reliably discharge resist solution each time in a prescribed amount. The process solution supplying mechanism is not limited to a pump. The process solution supplying mechanism may be, for example, a mechanism which supplies N2 gas into a resist solution tank 31A to apply a pressure on the process solution and to discharge the solution from the tank 31A.

Further, the embodiment described above applies the resist solution at a constant rate. Nonetheless, the solution may be discharged at a rate that changes stepwise. The solution-applying rate can be so change easily, by controlling the stepping motor 65.

The concept the present invention can be applied to any process of forming a film of solution on substrates. For example, the concept may be applied to a process of forming a silicon oxide film on wafers. Further, the concept may be applied to a step of supplying a developing solution onto wafers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A process solution applying apparatus comprising:
    a spin holder configured to hold a substrate;
    a plurality of supply systems configured to supply different types of process solutions to the substrate held by the spin holder, each of the supply systems having a supply mechanism configured to change a rate at which a process solution is supplied;
    a spin driver configured to rotate the spin holder, thereby rotating the substrate to spread a process solution by virtue of centrifugal force and to coat the substrate with the process solution; and
    a controller configured to control the supply systems, the controller having a storage section which stores data representing relationships between the process solutions and supply rates prescribed for the same, a selection section for selecting a process solution to be used from the process solutions, and a control section which selects a supply system corresponding to the selected process solution, and drives the supply mechanism of the selected supply system at a supply rate prescribed for the selected process solution.

2. The apparatus according to claim 1, wherein each supply rate has such a value that the corresponding process solution applied in a certain amount forms a process solution film having a uniform thickness on an entire surface of the substrate.

3. The apparatus according to claim 2, wherein the process solutions are different types of resist solutions, and the certain amount for forming the process solution film is set to be 2.0 ml or less.

4. The apparatus according to claim 1, wherein each supply mechanism has a positive-displacement pump for drawing and discharging a process solution, and a stepping motor for driving the positive-displacement pump and changing a rate of discharging the process solution when controlled in terms of rotation speed.

5. The apparatus according to claim 1, wherein each supply system has a replaceable supply tank storing a process solution, and the supply mechanism of the supply system has a detecting section for detecting the amount of the process solution remaining in the supply tank, in accordance with operation of the supply system.

6. The apparatus according to claim 1, wherein each supply system has a replaceable filter through which a process solution passes, and the supply mechanism of the supply system has a detecting section for detecting the time at which the filter is to be replaced, in accordance with operation of the supply system.

7. The apparatus according to claim 1, wherein the supply system further comprises respective nozzles for supplying a process solution, the apparatus further comprises a waiting section disposed outside the spin holder, for placing the nozzles, and a transfer system configured to pick up one of the nozzles from the waiting section and transfer the nozzle to a position above the substrate, and the controller is configured to drive the transfer system to transfer a nozzle corresponding to the selected supply system.

8. A resist solution applying apparatus comprising:
    a spin holder configured to hold a substrate;
    a plurality of supply systems configured to supply different types of resist solutions to the substrate held by the spin holder, each of the supply systems having a nozzle configured to supply a resist solution, and a supply mechanism configured to change a rate at which a resist solution is supplied;
    a spin driver configured to rotate the spin holder, thereby rotating the substrate to spread a resist solution by virtue of centrifugal force and to coat the substrate with the resist solution;
    a waiting section disposed outside the spin holder, for placing the nozzles; a transfer system configures to pick up one of the nozzles from the waiting section and transfer the nozzle to a position above the substrate; and a controller configured to control the supply systems and the transfer system, the controller having a storage section which stores data representing relationships between the resist solutions and supply rates prescribed for the same, a selection section for selecting a resist solution to be used from the resist solutions, and a control section which selects a supply system corresponding to the selected resist solution, drives the transfer system to transfer a nozzle corresponding to the selected supply system, and drives the supply mechanism of the selected supply system at a supply rate prescribed for the selected resist solution, wherein each supply rate has such a value that the corresponding resist solution applied in a certain amount forms a resist solution film having a uniform thickness on an entire surface of the substrate.

9. The apparatus according to claim 8, wherein the certain amount for forming the resist solution film is set to be 2.0 ml or less.

10. The apparatus according to claim 1, wherein each supply mechanism has a positive-displacement pump for drawing and discharging a resist solution, and a stepping motor for driving the positive-displacement pump and changing a rate of discharging the resist solution when controlled in terms of rotation speed.

11. The apparatus according to claim 1, wherein each supply system has a replaceable supply tank storing a resist solution, and the supply mechanism of the supply system has a detecting section for detecting the amount of the resist solution remaining in the supply tank, in accordance with operation of the supply system.

12. The apparatus according to claim 1, wherein each supply system has a replaceable filter through which a resist solution passes, and the supply mechanism of the supply system has a detecting section for detecting the time at which the filter is to be replaced, in accordance with operation of the supply system.

* * * * *